United States Patent [19]

Williams

[11] Patent Number: 4,595,543
[45] Date of Patent: Jun. 17, 1986

[54] METHOD OF FORMING PHOTOPOLYMERIC MOLDING PATTERN

[76] Inventor: Ray D. Williams, 1519 Atlantic, North Kansas City, Mo. 64116

[21] Appl. No.: 614,053

[22] Filed: May 25, 1984

[51] Int. Cl.⁴ .............................................. B29C 35/08
[52] U.S. Cl. ..................................... 264/22; 264/219; 425/174.4
[58] Field of Search ................. 264/132, 106, 22, 1.4; 428/147, 151; 264/236, 219, 221, 25; 425/174, 174.4

[56] References Cited

U.S. PATENT DOCUMENTS

| | | | |
|---|---|---|---|
| 2,595,734 | 5/1952 | Toulmin, Jr. | 264/132 |
| 4,038,123 | 7/1977 | Sammis | 264/132 |
| 4,064,205 | 12/1977 | Landsman | 264/132 |
| 4,144,300 | 3/1979 | Breeden | 264/132 |
| 4,294,782 | 10/1981 | Froehlig | 264/106 |

Primary Examiner—Jay H. Woo
Assistant Examiner—J. Fortenberry
Attorney, Agent, or Firm—D. A. N. Chase; Michael Yakimo, Jr.

[57] ABSTRACT

A novel molding pattern and method of making the same comprises the use of first and second image negatives sequentially positioned on opposed sides of a light sensitive resinous mass. Ultraviolet light waves are sequentially passed through each negative for user-selectable time periods so as to sensitize the portions of the resinous mass adjacent the image areas of each negative. Upon completion, a pattern is presented having a relatively offset primary image and a secondary background image with the secondary image also being in relief relative to a background area. The pattern is suitable for use in a casting-to-shape process or the like and eliminates the need for providing an engraved pattern with the primary and/or secondary images engraved thereon.

35 Claims, 15 Drawing Figures

METHOD OF FORMING PHOTOPOLYMERIC MOLDING PATTERN

BACKGROUND OF THE INVENTION

This invention generally relates to the field of product casting and more particularly to a novel photopolymeric molding/impression pattern and method of forming the same.

The art of casting involves the introduction of a material in an initial liquid state, e.g. molten metal, into a cavity or mold where, upon solidification, it becomes an object whose shape is determined by the configuration of the cavity or mold. There are two broad categories of casting processes, i.e. ingot casting and casting-to-shape. The latter process involves pouring the liquid into a cavity which has been configured to provide the final useful shape of the product. Casting-to-shape is generally classified according to the molding process and material or method of feeding the mold. Within this process are four basic types including sand, permanent-mold, die and centrifugal.

Sand casting provides the traditional method of casting-to-shape and is of particular interest as it produces the largest volume of casted-to-shape products. The basic process utilizes a mixture of sand grains, clay and other materials which is compacted around a pattern. Upon removal of the pattern, a cavity having a configuration corresponding to the pattern's configuration is impressed/presented within the surrounding mixture which corresponds to the desired shape of the product. Molten metal is then poured into the cavity and upon cooling assumes the shape thereof. The process can be repeated to present a plurality of casted-to-shape products having the same configuration.

An important step in sand casting is the preparation of the pattern. Patterns may be made from any material which will hold its shape during compaction of the surrounding sand mixture. A variety of materials can be used in pattern construction inclusive of wood, metal, aluminum alloy, cast iron, brass, plaster of paris etc. The pattern material used depends on the type and design intricacies of the finished casted product.

The use of a brass pattern is preferred in the casting of products which call for design intricacies thereon such as a textured or otherwise designed background relatively offset from the primary design of the finished product. Previously, such design intricacies had to be hand-engraved on the brass pattern which requires expensive skilled labor. This engraving expense increases the pattern cost which is necessarily reflected in the cost of the finished product. Accordingly, it is desirable to find an efficient cost-effective method of making a cost-effective pattern having design intricacies therein which are transferred to the finished product in a manner comparative to that of hand-engraved patterns.

In response thereto, I have devised a method of making an impression/casting pattern of a photopolymeric material which transfers design intricacies to the finished product without the utilization of an expensive hand-engraved brass pattern or the like. I utilize the sequential passage of ultraviolet light waves through designs on first and second image negatives which are sequentially located on opposed sides of a light-sensitive photopolymeric resin. The ultraviolet waves sensitize/harden the resin in configurations corresponding to the design images on the respective negatives. My method forms a pattern having a primary design thereon corresponding to the design image on one negative and a background design relatively offset from the primary design and having design intricacies in relief thereon corrresponding to the design image of the other negative. Upon mounting the finished pattern to a mounting plate or an impression blank corresponding to the overall product shape or a portion thereof, the rigidified pattern is suitable for use as an impression pattern in a casting-to-shape process for transfer of the primary and secondary designs to the finished product. Heretofore, such design intricacies were available only by utilizing a metal pattern having the design intricacies engraved thereon. Although I shall describe my novel pattern in relation to a belt buckle, it is understood that the resulting finished product and employed process to arrive at said finished product are not considered limitations on my invention.

It is therefore a general object of this invention to provide a new method for making an impression pattern having qualities comparable to a hand-engraved impression pattern.

Another general object of this invention is to provide a new method for making an impression pattern for use in a casting process or the like.

Still another object of this invention is to provide a novel impression pattern and method of making the same, as aforesaid, utilizing a photopolymeric resin as the pattern material.

Another particular object of this invention is to provide an impression pattern and method of making the same, as aforesaid, which utilizes first and second image negatives sequentially placed on opposed sides of said resin for sequential passage of ultraviolet light waves therethrough in a manner to shape the resin according to the design images of said negatives.

Another particular object of this invention is to provide an impression pattern and method of making the same, as aforesaid, wherein said pattern presents primary and secondary images in relief from a common background.

A still more particular object of this invention is to provide a pattern, as aforesaid, in which said secondary relief image is provided by the design image on one of said negatives with the primary relief image provided by the design image on the other said negatives.

Still a more particular object of the invention is to provide an impression pattern and method of making the same, as aforesaid, having design intricacies on said background in relative relief thereto.

Another object of this invention is to provide an impression pattern and method of making the same, as aforesaid, which is easily combined with a mounting plate or impression blank to present a composite impression pattern.

Other objects and advantages of this invention will become apparent from the following description taken in connection with the accompanying drawings, wherein is set forth by way of illustration and example, a preferred embodiment of this invention.

DESCRIPTION OF THE PREFERRED EMBODIMENT

Figure 1:
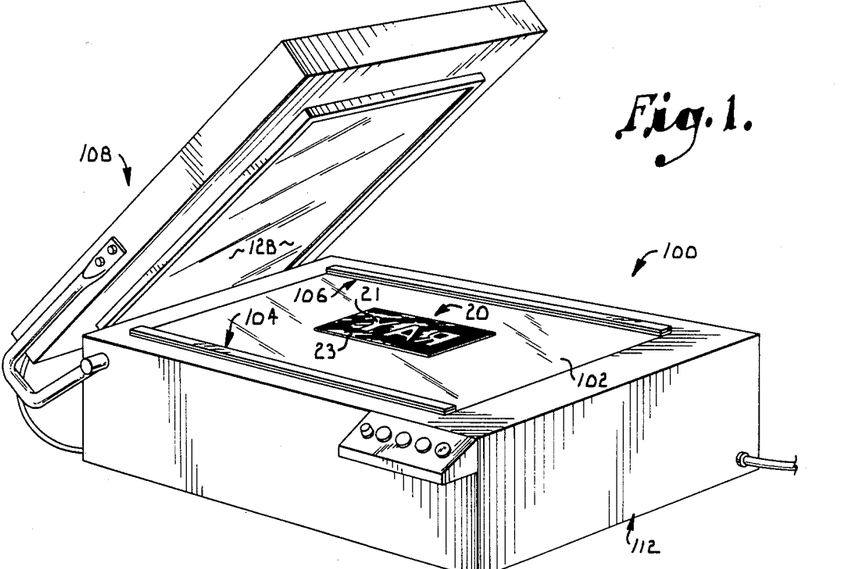
FIG. 1 is a perspective view showing an example of an apparatus utilized in my method of forming a photopolymeric impression pattern with a primary image negative positioned on the bottom support glass thereof.

Turning more particularly to the drawings, FIG. 1 shows one form of apparatus 100 utilized in the method of making my novel impression pattern. The device illustrated is a Merigraph photopolymer plate-making apparatus sold by the Graphics Systems division of Hercules, Inc. Such a device is used to make a photorelief plastic plate for use in the printing industry. However, the device utilized to make my novel impression pattern 40 is not to be considered a limitation on my claimed invention.

As shown in FIG. 1, a first image negative 20 is positioned atop the support glass 102 of the apparatus 100. This image negative 20 contains thereon a selected primary image area or design 21, e.g. "RAY", which is to appear in a first relief on the finished pattern. It is noted that the image area 21 is relatively transparent as compared to the surrounding opaque, non-image area 23 of the negative 20. The greater transparency of the primary image area 21 allows for passage of ultraviolet light waves therethrough.

This first image negative 20 is dusted with a tack rag or the like to clear any dust particles away from the facing surface. Atop the first image negative 20 is placed a clear protective film 22. This film 22 is placed between the shim bearers 104, 106 which extend along the longitudinal edges of the transparent support glass 102. Air pockets appearing between the film 22 and apparatus glass 102 should be removed either manually or by the vacuum system incorporated in the apparatus 100 so as to preclude shifting of the negative 20. The protective film 22 precludes contact of the resinous material 24 with this first image negative 20.

Figure 11:
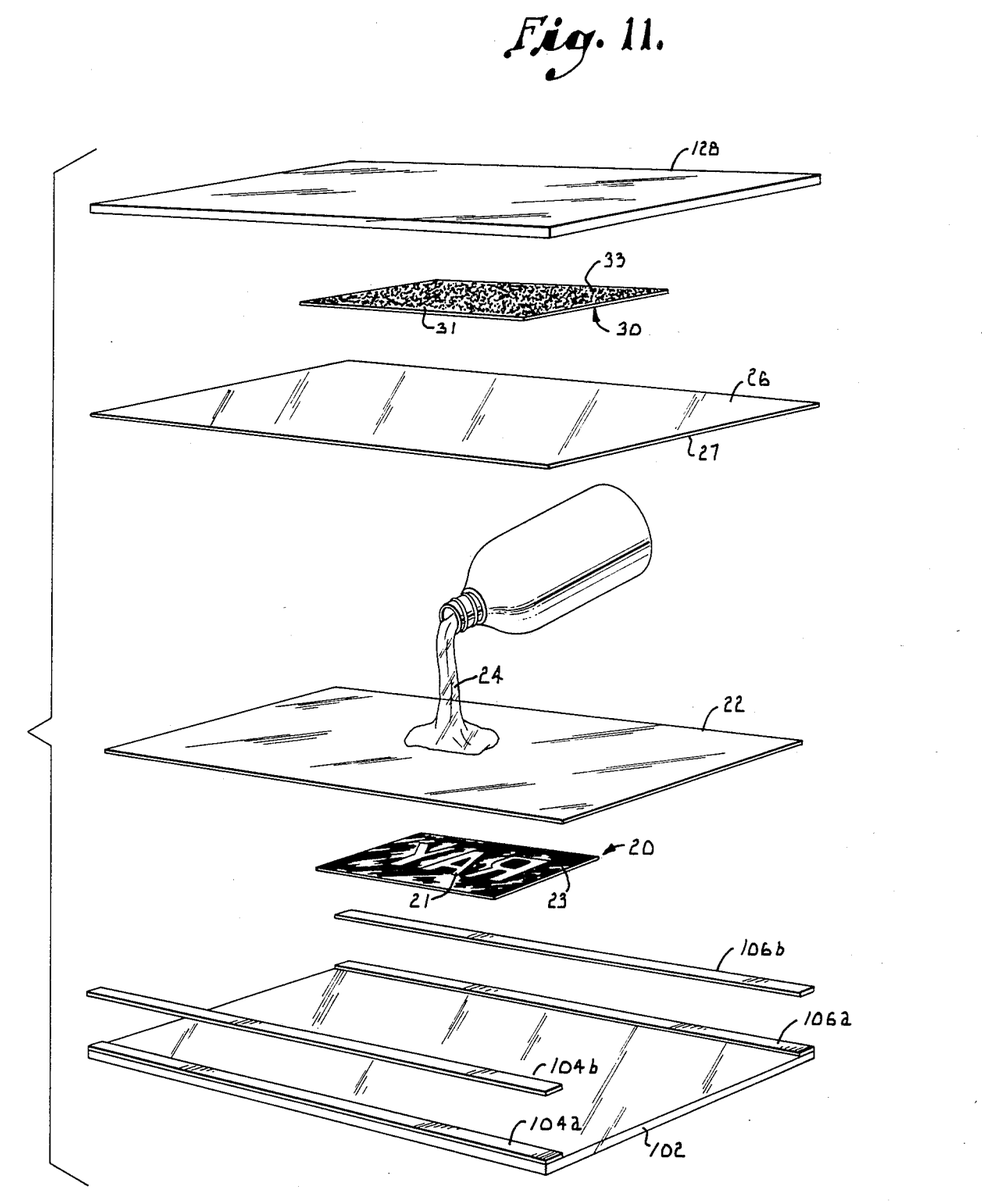
FIG. 11 is an exploded view showing the relationship of the elements utilized in my novel method.
Figure 12:
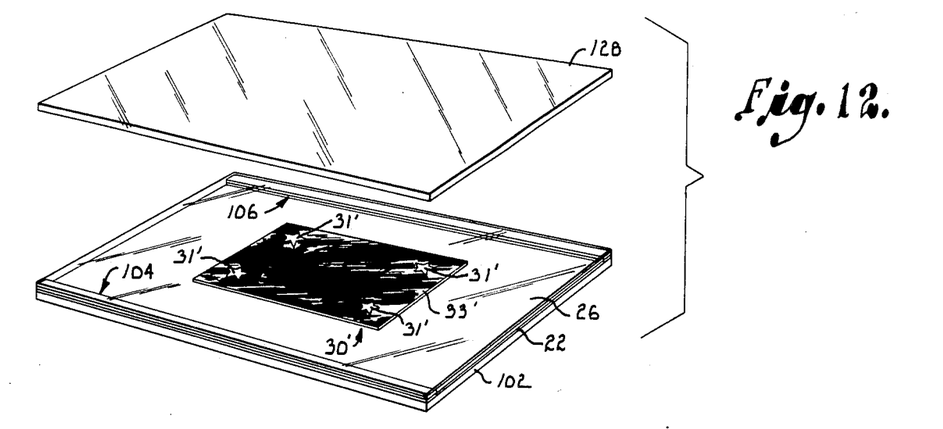
FIG. 12 is a perspective view similar to that of FIG. 6 and showing the placement of an alternative background image negative, between the underlying backing sheet and the exploded top glass.

Subsequently, a liquid photopolymer resin 24, sensitive to ultraviolet light, is poured atop the film 22 and first image negative 20 as illustrated in the exploded view of FIG. 11. This resin 24 should substantially cover the area of the first image negative 20 as protected by the film 22.

Figures 2, 3, 4, 5:
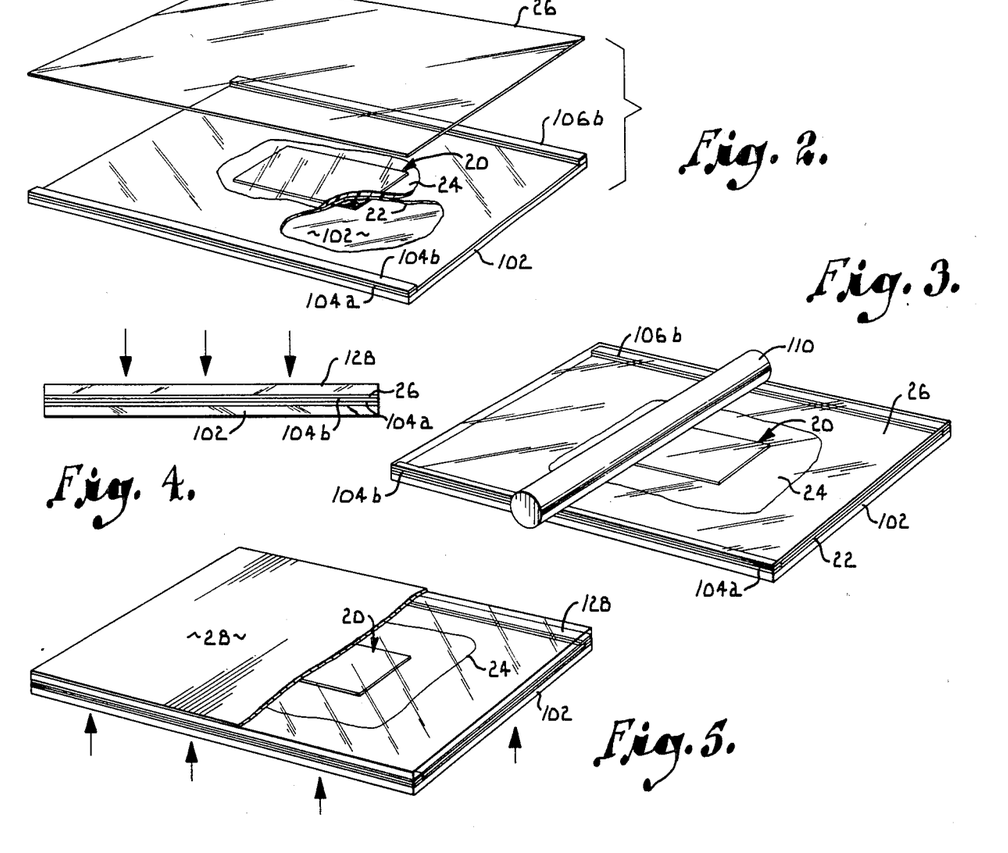
FIG. 2 is a perspective view of a portion of the elements used in my method, with the non-exploded elements broken away to assist in illustration, showing the primary image negative, a clear protective film over the primary negative, the photopolymer resin over the protective film and a clear backing sheet exploded away from the underlying resin.
FIG. 3 is a perspective view showing the use of a solid steel shaft to smooth the underlying resin as covered by the backing sheet shown as exploded in FIG. 2.
FIG. 4 is a side view of the elements in FIG. 3 showing the lower support glass, shim bearers, backing sheet and top glass one atop the other and diagrammatically showing the passage of ultraviolet light waves through the top glass.
FIG. 5 is a perspective view illustrating a broken-away light resistant material covering the top glass and diagrammatically showing the passage of ultraviolet light waves through the bottom glass.

Atop the resin 24 and bearers 104, 106 is placed a clear polyester backing sheet 26 (preferably seven-mils in thickness) as shown in FIG. 2. It is preferred that the inferior side 27 of the backing sheet 26 have an adhesive tack thereon which contacts the underlying resin 24. As shown in FIG. 3, a shaft 110 is placed atop the bearers 104, 106 and rolled back and forth therealong so as to smooth the backing sheet 26 and underlying resin 24. The thickness of the resin 24 and the resulting pattern 40 is thus controlled by the height of the shim bearers 104, 106 above the support glass 102. As illustrated in FIG. 11, either one pair of shim bearers 104a, 106a or a plurality thereof 104b, 106b are utilized along the longitudinal extent of the glass 102 according to the desired thickness of the smoothed resin 24 and resulting pattern 40.

After the resin 24 has been smoothed by roller 110, a top glass 128 is placed atop the bearers 104, 106. This top glass 128 is shown in FIG. 1 as incorporated in the top frame 128 of apparatus 100 and is severally shown as 128 in the other figures. Ultraviolet light waves are then normally passed/exposed through the top glass 128, backing sheet 26 and resin 24 as diagrammatically illustrated in FIG. 4. The ultraviolet lamps (not shown) are located in the top frame 108 of the illustrated apparatus 100. As the ultraviolet light waves are passed/exposed through the backing sheet 26, the light-sensitive resin 24 hardens and bonds with the backing sheet 26. The extent of resin 24 hardened between the backing sheet 26 and towards the underlying support glass 102 is determined by the time period of passage/exposure of the ultraviolet light waves through the overlying glass 128, backing sheet 26 and into the underlying resin 24. Thus, a uniform layer of sensitized resin 24 adjacent said backing sheet 26 is presented. Approximately a ten second period of exposure has been found satisfactory.

After this initial exposure of light waves at a first selected time period, the top glass 128 is covered with a light resistant material 28 as shown in FIG. 5. In the utilized apparatus 100, a shutter in the top frame 108 is interposed between the ultraviolet lamps and top glass 128. Subsequently, ultraviolet light waves are normally passed/exposed through the bottom glass 102 for approximately 60 seconds as diagrammatically shown in FIG. 5. (These ultraviolet lights are found in the base frame 112 of the illustrated apparatus 100). The ultraviolet light waves normally pass through the primary image area 21 of the first image negative 20, i.e. the designation "RAY", and into the overlying resin 24 so as to sensitize/harden the portions of the resin 24 adjacent this primary image area 21. The relatively opaque, non-image area 23 of negative 20, absorbs the ultraviolet light waves which precludes passage of the light waves into the resin 24 so that the portions of the resin 24 adjacent the non-image area 23 of negative 20 are not sensitized/hardened. The light resistant material 30 impedes passage of such light waves through the resin 24 which improves the efficacy of the interaction of the light waves with the portions of resin adjacent the primary image area 21. The extent of the resin 24 hardened from the lower glass 102 and towards the upper glass 128 is determined by the time period of passage/exposure of the ultraviolet light waves into the resin 24. An exposure period of 60 seconds has been found satisfactory to sensitize/harden the resin 24, adjacent the primary image 21, extending between the film 22 and backing plate 26.

Figures 6, 7:
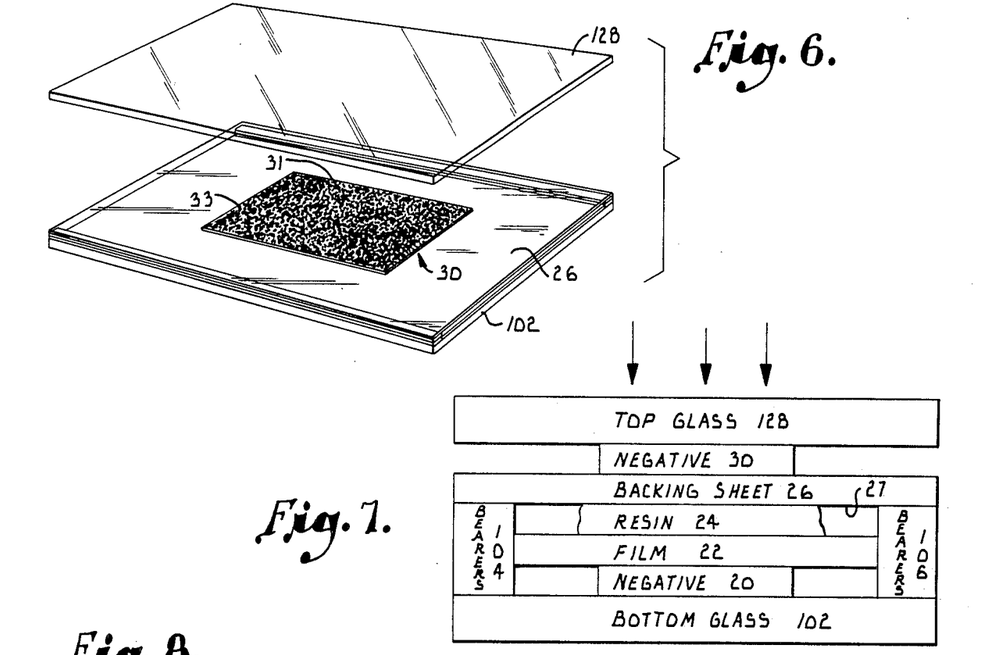
FIG. 6 is a perspective view showing the placement of a second image negative between the underlying backing sheet and the exploded top glass.
FIG. 7 is a diagrammatic view of the element array in FIG. 6 and showing the interrelationship of the employed elements upon passage of ultraviolet light waves through the top glass and underlying second/background negative.

Subsequently, the light resistant material 28 and top glass 128 are removed and a second image negative 30 is placed over the backing sheet 26 and in alignment with the first image negative 20. The top glass 128 is then positioned atop the backing sheet 26. This second image negative 30 contains a relatively transparent image area 31 and an opaque, non-image area 33. The image area 31 is a user-selectable design of a desired background relative to the primary image 21 ("RAY") in the finished pattern. The background image 31 may be of any user-selectable design intricacies inclusive of those intricacies which have heretofore been available only upon the use of hand-engraved metal impression patterns. As shown in the drawings, particularly in FIG. 6, this particular second image or background negative 30 consists of a design having a mixture of intermingled transparent ("image") 31 and opaque ("non-image") 33 portions thereon. These portions 31, 33 are shown as white and dark shadings on negative 30.

Upon the above-described placement of the second image negative 30, the top glass 128 is positioned atop the bearers 104, 106. Ultraviolet light waves are normally passed/exposed through the top glass 128, second image negative 30 and into the underlying resin 24 for approximately 10 seconds. The transparent ("image") portions 31 of the negative 30 allow passage of these ultraviolet light waves therethrough and into the underlying resin 24. The opaque ("non-image") portions 33 absorb the light waves and thus delimit passage of the light waves into the resin therethrough. Thus, the pattern of light waves passing into the adjacent resin 24 corresponds to the image area 31 of the negative 30 and will sensitize/harden the underlying resin 24 according to the design of the image area 31. The image area 31 shown in negative 30 will present in the finished pattern 40 a plurality of projections 41 extending from the previously formed bonding layer of resin 24 as above-described. This layer is generally deisignated as 43 in FIG. 9. As the exposure time of light waves through negative 30 is less than the above-described exposure time of light waves through negative 20, the extent of the resin 24 hardened from the backing sheet 26 and towards film 22 is less than the extent of resin 24 hardened from film 22 and towards the backing sheet 26. Thus, first and second relatively offset portions of resin 24 are hardened corresponding to the image areas/designs 21, 31 found on the first and second image negatives 20, 30.

Figure 8:
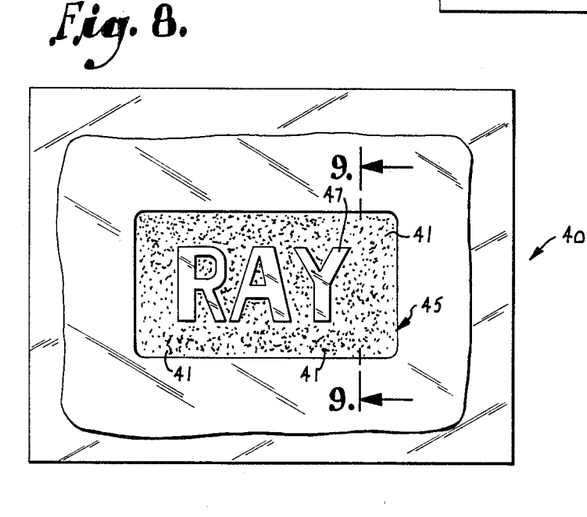
FIG. 8 is a plan view showing a finished impression pattern and the primary and secondary offset designs therein.
Figure 9:
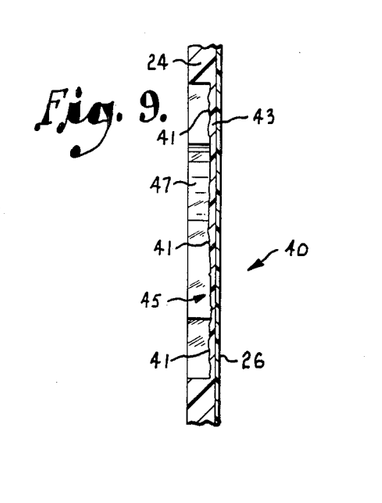
FIG. 9 is a sectional elevation view, taken along line 9—9 in FIG. 8, and showing the offset between the primary and secondary designs with the latter presenting a textured background relative to the primary design.

After this third time period of light wave exposure, the backing sheet 26 and resin 24 bonded thereto is removed with the clear protective film 22 being stripped therefrom. The backing sheet and attached resin is washed in a warm water and detergent solution which removes those portions of the resin 24 which have not been sensitized/hardened by the ultraviolet light waves. As above-described, these non-sensitized portions of resin were adjacent the opaque or non-image portions 21, 31 of the image negatives 20, 30. After removal of such non-sensitized portions, a pattern 40 is presented, as shown in FIGS. 8 and 9, that has the primary image 21, i.e. "RAY" 47, in relief from the background 45 thereof. The background 45 presents a textured effect in the form of the plurality of projections 41 corresponding to the image area 31 appearing on negative 30 as above-described. Thus, a textured background is presented relative to the primary design 47, such texture heretofore having been available only by means of a hand-engraved metal pattern. It is here noted that if no negative 30 is used that a smooth planar background will be presented relative to the primary design 47.

The time of ultraviolet light wave exposure through the image area 31 of image negative 30 determines the degree of relief of the projections 46 from the underlying background layer of resin. This background layer was formed during the above-described bonding step. The greater this time period, the greater the degree of relief/extension of the projections 46. Thus, a rougher texture effect of background 45 is created. Conversely, a lesser time of exposure will create a smoother texture effect of the background 45. Also the relative offset between the primary image 47, i.e. "RAY", and secondary image 41, i.e. the nub-like projections, is controlled by the relative difference in time periods of ultraviolet light wave exposure through the respective image negatives 20, 30. This assumes that the thickness of the resin layer 43 made during bonding remains the same.

Figure 13:
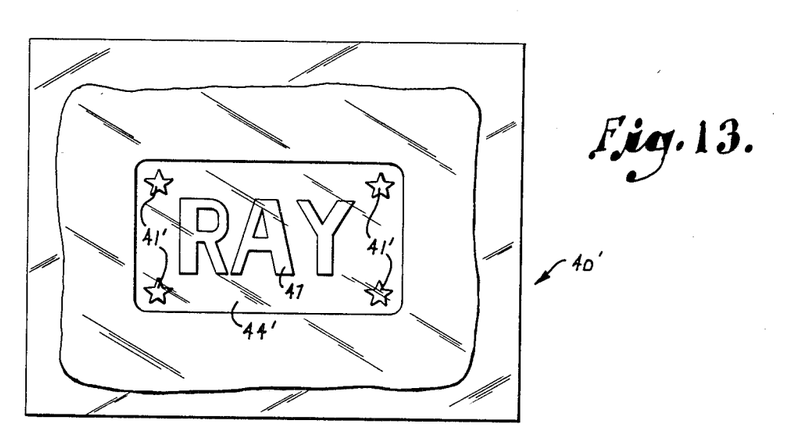
FIG. 13 is a plan view showing a finished impression pattern utilizing the background image negative shown in FIG. 12.
Figure 14:
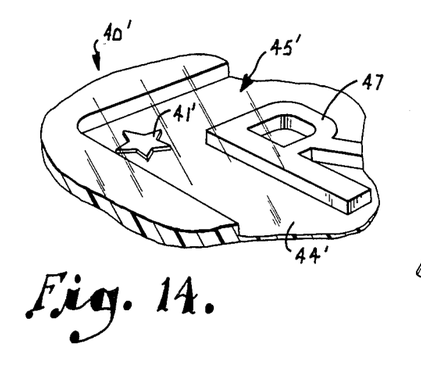
FIG. 14 is a perspective fragmentary view of a corner of the pattern in FIG. 13 and on an enlarged scale, and showing the offset of first and second design images and their relative relief from a planar background.

I also show in FIGS. 12-15 the use of an alternative second image negative 30' to assist in illustration. The transparent image area 31' is the four stars 31' shown in the corners of the negative. The opaque, non-image area 33' of the negative 30' completely surrounds these stars 31'. Upon utilization of the second image negative 30', in a manner as above-described, each star 31' appears in relief as 41' from a generally planar background 44' as shown in FIG. 14. Accordingly, an impression pattern 40', as shown in FIG. 13, is presented.

Again the time of ultraviolet light wave exposure through the image area 31' of image negative 30' determines the degree of relief of each star 41' from the background 44'. The greater the time period of light wave exposure, the greater the degree of relief/extension of the stars 41' from the background 44'. Conversely, a lesser time of exposure creates a lesser relief of the stars 41' from the background 44'. Again the relative offset between the primary image 47, i.e. "RAY", and the secondary image 41', i.e. the stars, is determined by the relative difference in time periods of ultraviolet light wave exposure through the respective negatives 20, 30'.

Figure 10:
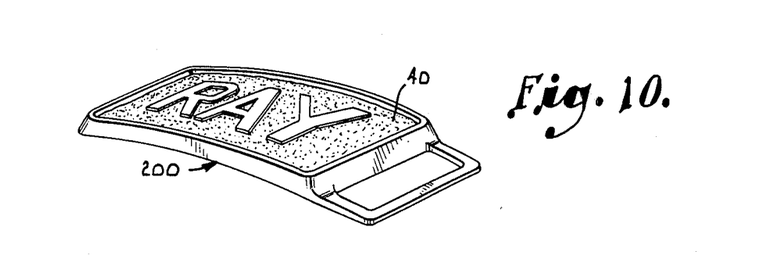
FIG. 10 is a perspective view illustrating the trimmed pattern of FIG. 9 in place on the face of a belt buckle pattern blank prior to use in a casting-to-shape process.
Figure 15:
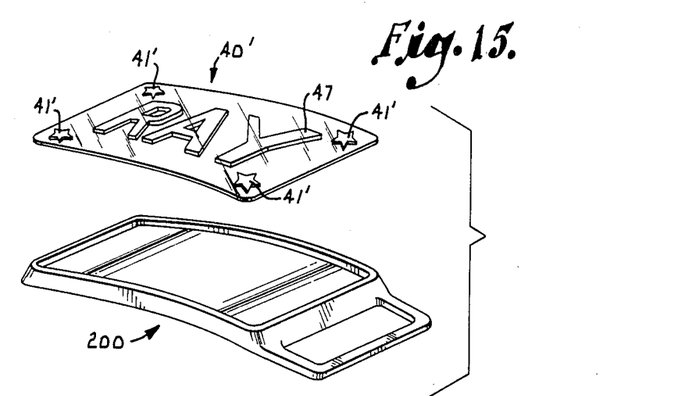
FIG. 15 is a perspective exploded view showing the exploded trimmed pattern prior to its placement on the face of a belt buckle pattern blank prior to use in a casting-to-shape process.

Either pattern 40 or " can be subsequently used as and impression pattern in a casting-to-shape process or the like. In such an application, the pattern 40, 40' is preferably rigidified enabling it to hold its shape and make the proper impression in the casting mixture. Pattern 40 is shown in FIG. 10 as affixed to the face of a metal belt buckle blank 200. Pattern 40' is shown in FIG. 15 exploded away from the belt buckle blank 200. Thus, the use of the selected pattern with an impression blank corresponding to the desired product shape presents a composite pattern generally designated as 240, 240'. Such composite pattern is suitable for use in a sand casting process or the like. Either pattern 40, 40' may also be attached to a suitable mounting plate to provide for the preferred rigidification. Upon such rigidification, the composite pattern 200 or 200' is used in the casting process as any other casting pattern. Accordingly, upon completion of the casting-to-shape process a belt buckle is formed having relatively offset primary 47 and secondary 31 background designs thereon. Heretofore, such a casted-to-shape product has been available only through the use of hand-engraved metal patterns or the like.

Although I have particularly described the above method of making a pattern in relation to casting a belt buckle having particular designs thereon, it is understood that the manner of use of my impression pattern and the product made therefrom are not to be considered limitations on my invention unless otherwise set forth in the following claims.

Having thus described the invention what is claimed as new and desired to be secured by Letters Patent is as follows:

1. A method of making an impression pattern comprising the steps of:
   (a) providing a first image negative with said negative having an image area thereon allowing for passage of certain light waves therethrough;
   (b) positioning a resin sensitive to said certain light waves adjacent said first negative;
   (c) placing a backing sheet over said resin;
   (d) passing said certain light waves through said backing sheet for a first selected time period to harden a layer of said resin adjacent said backing sheet whereby to bond said backing sheet to said resin;
   (e) passing said certain light waves through said first image negative and onto said resin for a second selected time period, said certain light waves passing through said image portion of said first negative and into said resin in a manner to harden the portion of said resin adjacent said image area on said negative;
   (f) providing a second image negative, said second negative having an image area thereon allowing for passage of said certain light waves therethrough;
   (g) placing said second image negative over said backing sheet and in alignment with said first image negative;
   (h) passing said certain light waves through said second image negative and said backing sheet and onto said resin for a third selected time period, said certain light waves passing through said image area of said second negative and into said resin in a manner to harden said resin adjacent said image area of said second negative; and
   (i) removing the non-hardened portions of said resin whereby to present a pattern comprising said backing sheet and having first and second portions of said hardened resinous material projecting therefrom, said respective portions having configurations corresponding to said images on said respective first and second negatives.

2. The method as claimed in claim 1 further comprising the step of positioning said first image negative on a glass plate allowing for passage of said certain light waves therethrough, said glass plate offering support to said first image negative and other materials subsequently placed thereon.

3. The method as claimed in claim 1 further comprising the step of positioning a clear film over said first image negative to protect the same from said resin.

4. The method as claimed in claim 1 wherein said step of placing said backing sheet over said resin further comprises the steps of:
   supporting said backing sheet over said first negative at a distance corresponding to the desired thickness of said pattern; and
   applying pressure along said backing sheet whereby to shape the resin covering said first negative to a thickness corresponding to said distance.

5. The method as claimed in claim 1 further comprising the step of covering said backing sheet with a light resistant material prior to passing said light waves through said first image negative whereby to delimit the rate of passage of said light waves through said resin.

6. The method as claimed in claim 1 wherein said step of passing said light waves through said first negative and into said resin hardens the extent of said resin extending between said first negative and said backing sheet according to the length of said second time period.

7. The method as claimed in claim 1 wherein said certain light waves passing through said second image negative hardens the extent of said resin between said backing sheet and said first negative according to the length of said third time period.

8. The method as claimed in claim 1 wherein said second time period is greater than said third time period whereby the extent of said resin hardened by said certain light waves passing through said first image negative is greater than the extent of said resin hardened by said certain light waves passing through said second image negative whereby said first and second portions of said hardened resin are offset one from the other.

9. The method as claimed in claim 1 wherein said second time period is greater than said first time period whereby said second portion of said resinous materials is offset from said layer of resin hardened by said certain light waves passing through said backing sheet for a first time period.

10. The method as claimed in claim 1 further comprising the step of rigidifying said pattern whereby to maintain the shape of said pattern during subsequent use.

11. The method as claimed in claim 1 further comprising the step of rigidifying said pattern including the step of mounting said pattern to a rigid impression pattern whereby to present a composite impression pattern for subsequent use.

12. The method as claimed in claim 2 further comprising the step of positioning a clear film over said first image negative and said glass plate to protect the same from said resin.

13. The method as claimed in claim 12 further comprising the step of removing the air between said film and said glass to preclude shifting of said first negative during performance of said method.

14. The method as claimed in claim 13 wherein said light responsive resin is poured on said film and said glass plate in a manner to cover said first negative.

15. The method as claimed in claim 14 wherein said step of placing said backing sheet over said resin further comprises the steps of:
supporting said backing sheet over said first negative at a distance corresponding to the desired thickness of said pattern; and
applying pressure along the extent of said backing sheet whereby to shape the resin covering said first negative to a thickness corresponding to said distance.

16. The method as claimed in claim 15 wherein said supporting step is provided by positioning at least one shim member between said glass plate and said backing sheet in a manner to displace said backing sheet away from said glass plate and said negative thereon.

17. The method as claimed in claim 15 further comprising the step of covering said backing sheet with a light resistant material prior to passing said light through said first image negative whereby to delimit the rate of passage of said ultraviolet light through said resin.

18. The method as claimed in claim 17 wherein said certain light waves passing through said first negative and into said resin hardens said resin between said first negative and said backing sheet to an extent therebetween according to the length of said second time period.

19. The method as claimed in claim 18 wherein said certain light waves passing through said second image negative hardens the extent of said resin between said backing sheet and said first negative according to the length of said third time period.

20. The method as claimed in claim 19 wherein said second time period is greater than said third time period whereby the extent of said resin hardened by said certain light waves passing through said first image negative is greater than the extent of said resin hardened by said certain light waves passing through said second image negative whereby said first and second portions of said hardened resin are offset one from the other.

21. The method as claimed in claim 20 wherein said second time period is greater than said first time period whereby said second portion of said resinous material is offset from said layer of resin hardened by said certain light waves passing through said backing sheet for a first time period.

22. The method as claimed in claim 21 further comprising the step of rigidifying said pattern whereby to maintain the shape of said pattern during subsequent use.

23. The method as claimed in claim 21 further comprising the step of rigidifying said pattern including the step of mounting said pattern to a rigid impression pattern whereby to present a composite impression pattern for subsequent use.

24. The method as claimed in claim 1 wherein certain light waves are provided by ultraviolet lamps.

25. A method of making an impression pattern comprising the steps of:
(a) positioning a resinous mass in a selected relationship with a source of certain light waves, said certain light waves variously hardening said resinous mass according to the time of passage therethrough;
(b) positioning a backing sheet adjacent a first side of said resinous mass;
(c) bonding said backing sheet to said first side of said resinous mass;
(d) providing a first image negative having an image portion therein allowing for passage of said certain light waves therethrough;
(e) positioning said first image negative on a selected side of said resinous mass;
(f) passing said certain light waves through said image portion of said first negative and into said resinous mass, said certain light waves passing into said resinous mass hardening a portion of said resin adjacent said image portion of said negative;
(g) providing a second image negative with said second negative having an image portion therein allowing for passage of said certain light waves therethrough;
(h) positioning said second image negative on the side of said resinous mass opposite said first image negative;
(i) passing said certain light waves through said image portion of said second negative and into said resinous mass, said certain light waves passing into said resinous mass hardening a portion of said resin adjacent said image portion of said second negative; and
(j) removing the non-hardened portions of said resinous mass whereby to present a pattern comprising said backing sheet and having first and second portions of said hardened resinous mass projecting therefrom, said respective portions having configurations corresponding to said images on said first and second negatives.

26. The method as claimed in claim 25 wherein said step of bonding said backing sheet to said first side of said resinous mass comprises the step of:
passing said certain light waves through said backing sheet for a selected time period to harden a layer of said resin adjacent said backing sheet and combine the same with said resin with said respective first and second portions of said hardened resinous mass extending beyond said layer of resin.

27. The method as claimed in claim 25 wherein said respective steps of passing said certain light waves through said respective negatives occur for different time periods to produce a differential in the extent of said hardening of portions of said resinous mass whereby to present an offset between said first and second portions of said hardened, resinous mass.

28. The method as claimed in claim 26 wherein one of said negatives is positioned adjacent said backing sheet, said step of passing said certain light waves through said negative adjacent said backing sheet occurs for a selected time period to harden said resinous mass adjacent said image portion of said negative and said backing sheet and beyond said bonding layer of resin.

29. The method as claimed in claim 28 wherein the other of said negatives is positioned adjacent the side of said resin opposite said backing sheet, said step of passing said certain light waves therethrough hardens said resinous mass adjacent said image portions of said negative and between said negative and said backing sheet.

30. A method of making an impression pattern comprising the steps of:

(a) positioning a resinous mass in a selected relationship with a source of certain light waves, said certain light waves variously hardening said resinous mass according to the time of passage therethrough;

(b) providing a first image negative having an image portion therein allowing for passage of said certain light waves therethrough;

(c) positioning said first image negative on a selected side of said resinous mass;

(d) passing said certain light waves through said image portion of said first negative and into said resinous mass, said certain light waves passing into said resinous mass hardening a portion of said resin adjacent said image portion of said negative;

(e) providing a second image negative with said second negative having an image portion therein allowing for passage of said certain light waves therethrough;

(f) positioning said second image negative on the side of said resinous mass opposite said first image negative;

(g) passing said certain light waves through said image portion of said second negative and into said resinous mass, said certain light waves passing into said resinous mass hardening a portion of said resin adjacent said image portion of said second negative; and (h) removing the non-hardened portions of said resinous mass whereby to present a pattern comprising first and second portions of said hardened resinous mass, said respective portions having configurations corresponding to said images on said first and second negatives.

31. The method as claimed in claim 30 further comprising the steps of:

(a) positioning a backing sheet adjacent a first side of said resinous mass;

(b) bonding said backing sheet to said first side of said resinous mass whereby said respective portions project from said backing sheet.

32. The method as claimed in claim 31 wherein said step of bonding said backing sheet to said first side of said resinous mass comprises the step of:

passing said certain light waves through said backing sheet for a selected time period to harden a layer of said resin adjacent said backing sheet and combine the same with said resin with said respective first and second portions of said hardened resinous mass extending beyond said layer of resin.

33. The method as claimed in claim 30 wherein said respective steps of passing said certain lights waves through said respective negatives occur for different time periods to produce a differential in the extent of said hardening of portions of said resinous mass whereby to present an offset between said first and second portions of said hardened, resinous mass.

34. The method as claimed in claim 31 wherein one of said negatives is positioned adjacent said backing sheet, said step of passing said certain light waves through said negative adjacent said backing sheet occurs for a selected time period to harden said resinous mass adjacent said image portion of said negative and said backing sheet and beyond said bonded layer of resin.

35. The method as claimed in claim 34 wherein the other of said negatives is positioned adjacent the side of said resin opposite said backing sheet, said step of passing said certain light waves therethrough hardens said resinous mass adjacent said image portions of said negative and between said other negative and said backing sheet.

* * * * *